United States Patent [19]

Welsch

[11] Patent Number: 4,915,746

[45] Date of Patent: Apr. 10, 1990

[54] METHOD OF FORMING HIGH TEMPERATURE BARRIERS IN STRUCTURAL METALS TO MAKE SUCH METALS CREEP RESISTANT AT HIGH HOMOLOGOUS TEMPERATURES

[76] Inventor: Gerhard E. Welsch, 2514 Edgehill Rd., Cleveland Hts., Ohio 44106

[21] Appl. No.: 232,284

[22] Filed: Aug. 15, 1988

[51] Int. Cl.$^4$ .................. C21D 10/00; C22F 3/00
[52] U.S. Cl. ........................ 148/4; 148/900; 428/607; 427/111; 427/38
[58] Field of Search ............ 148/4, 127, 423, 900; 428/607, 660, 665; 204/192.31, 192.34; 427/111, 38, 124

[56] References Cited

U.S. PATENT DOCUMENTS

| | | | |
|---|---|---|---|
| 3,806,380 | 4/1974 | Kitada et al. | 148/159 |
| 3,811,936 | 5/1974 | Archer et al. | 427/111 |
| 3,832,219 | 8/1974 | Nelson et al. | 117/93.3 |
| 3,900,636 | 8/1975 | Curry et al. | 427/38 |
| 4,088,799 | 5/1978 | Kurtin | 427/38 |
| 4,105,443 | 8/1978 | Dearnaley | 75/238 |
| 4,296,352 | 10/1981 | Berlec et al. | 427/111 |
| 4,372,985 | 2/1983 | Bailey | 427/38 |
| 4,433,005 | 2/1984 | Manty et al. | 427/38 |
| 4,520,040 | 5/1985 | Cordts | 427/38 |
| 4,542,009 | 9/1985 | Palmer | 423/561 R |
| 3,397,782 | 8/1968 | Imura et al. | 427/38 |
| 4,556,583 | 12/1985 | Imura et al. | 427/38 |
| 4,743,308 | 5/1988 | Sioshansi et al. | 148/900 |

FOREIGN PATENT DOCUMENTS 0039152  3/1982  Japan .................... 148/423

OTHER PUBLICATIONS

Metals Handbook 9th Edition, vol. 5 pp. 422–425 8/11/83.
R. P. Elliott: Constitution of Binary Alloys, First Supplement, McGraw-Hill (1965).
F. A. Shunk: Constitution of Binary Alloys, Second Supplement, McGraw-Hill (1969).
M. Hanson and K. Anderko: Constitution of Binary Alloys, McGraw-Hill (1958).
N. F. Mott and H. Jones; The Theory of the Properties of Metals and Alloys, Dover Publications 1958, pp. 318–319.
W. G. Moffatt, G. W. Pearsall and J. Wulff: The Structure and Properties of Materials, John Wiley and Sons, vol. 1 (1967) 206, 207.
W. G. Moffatt: The Handbook of Binary Phase Diagrams, General Electric Co., Schenectady, N.Y. (1978).
M. Hansen: Der Aufbau der Zweistofflegierungen, Springer (1936) 675.

*Primary Examiner*—S. Kastler
*Attorney, Agent, or Firm*—Fay, Sharpe, Beall, Fagan, Minnich & McKee

[57] ABSTRACT

A method of forming internal high temperature barriers in structural metals is provided. The barriers prevent movement of boundaries and dislocations inside the structural metal, and make strutural metals creep resistant at high homologous temperatures. The method comprises providing a first layer of strutural metal, implanting ions into this layer, and layering a second layer of structural metal on the ion-implanted first layer to form a laminated product. The steps of implanting and layering can be repeated an arbitrary number of times.

47 Claims, 5 Drawing Sheets

METHOD OF FORMING HIGH TEMPERATURE BARRIERS IN STRUCTURAL METALS TO MAKE SUCH METALS CREEP RESISTANT AT HIGH HOMOLOGOUS TEMPERATURES

BACKGROUND OF THE INVENTION

This application pertains to the art of internal structure modification of metal, and more particularly to internal structure modification of metal by ion implantation.

The invention is particularly applicable to internal structure modification of metals that creep at high homologous temperatures and will be described with particular reference thereto. However, it will be appreciated that the invention has broader application and may be advantageously employed in other environments.

Heretofore, metals that tend to creep at high homologous temperatures have been unable to provide and withstand a desired grain shape when exposed to elevated temperatures. Such metals generally tend to recrystallize as temperatures increase, and when this recrystallization occurs, columnar grains spread through the thickness of the metal, causing the metal to become brittle with a likelihood of breaking. The tendency to creep limits the usefulness of many metals, and it has been necessary to dope such metals with certain other elements to promote creep resistance.

Lamp wire is a prominent example of creep resistant metal at very high temperature. Whereas, pure tungsten (and some tungsten alloys) recrystallizes at temperatures not much higher than 1000° C. and creeps under relatively low loads, e.g., its own weight, the potassium-doped tungsten lamp wire does not fully recrystallize until temperatures of greater than approximately 2000° C. are reached. Further, the doped material maintains good creep resistance in lamp wire at high temperatures, e.g., at temperatures greater than 2500° C., and is therefore useful for lamp filaments.

The reasons for this good creep resistance in lamp wire are fairly well understood. The relatively large potassium atoms are virtually insoluble in the tungsten matrix, and because of its large atomic size, potassium does not diffuse readily through the metal lattice. The potassium atoms are trapped in the metal and form bubbles. The bubbles act as pinning points against the movement of dislocations and grain boundaries, and thereby counteract creep and recrystallization. The pinning efficiency is good with a high density of small bubbles, i.e., a large number of bubbles per unit area over which a grain boundary or a dislocation can be pinned. It has been reported that for potassium-doped lamp wire, the pinning strength at 2150° C. is best for bubble sizes smaller than 600 Angstroms.

The fine bubbles in their arrangement in the lamp wire is achieved through extensive thermo-mechanical processing. Initially, the potassium is introduced into the material by doping the tungsten powder. After pressing and sintering, there is considerable mechanical deformation processing by rolling, swaging, and wire drawing. By this mechanical working, the potassium clusters are dispersed into long and very fine ribbons, and the desired fine distribution is achieved. When the material is subjected to high temperatures, the ribbons break up into stringers of fine bubbles, which perform their role of pinning dislocations and grain boundaries. Very large deformations are necessary to effectively produce the fine distribution of the potassium dopant. Such large deformations are achieved during repeated wire drawing, where for example, the reduction is a cross-sectional area and the elongation is as large as by a factor of 1,000 to 1,000,000.

Although conventional lamp filaments provide creep resistance, over 50 processing steps are necessary to accomplish their production. That is, the various stages of mechanical working described above may each occur a plurality of times. In addition, the method of doping lamp filaments as described above does not work for other geometries such as flat sheets because it is not possible to accomplish such extensive plastic deformation in geometries other than those similar to lamp wire.

It is desirable to define a simpler method of making metals, particularly lamp filaments, creep resistant at elevated temperatures. Accordingly, the present invention contemplates a process which overcomes all of the abovedescribed problems and others to provide a method for making metals, particularly lamp filaments, creep resistant at elevated temperatures so as to cause the metal's grain shape to remain intact. These results are achieved by layering in conjunction with ion implantation.

SUMMARY OF THE INVENTION

In accordance with the present invention, there is provided a method of making certain metals creep resistant at high homologous temperatures by ion implantation. The method involves providing a first layer of metal, implanting ions in the first layer, and providing an additional layer of metal on the first. The step of implanting and providing an additional layer may be repeated an arbitrary number of times.

In accordance with a more limited aspect of the invention, there is provided a method for making structural metals, as well as other categories of metals, namely refractory metals, creep resistant at high homologous temperatures by ion implantation. A first layer of structural metal is provided, the metal of a type that tends to creep at high homologous temperatures and that has zero or very low solubility for ions from the group consisting of xenon, argon, krypton, neon, helium, potassium, rubidium, cesium and francium. Ions are then implanted on the first layer of metal, the ions consisting of xenon, argon, krypton, neon, helium, potassium, rubidium, cesium, francium or mixtures thereof. A second layer of structural metal is layered or otherwise formed on the first ion-implanted layer. The second layer of structural metal can then be impregnated with a second layer of the above-mentioned ions, with a third layer of structural metal being layered thereon. The implanting and layering steps can continue to repeat for an arbitrary number of layers to form a laminated product; however, limiting the product to two layers of structural metal with a single deposition of ions on the first layer is sufficient for many purposes. Tungsten filaments, for example, often only require a first layer of tungsten to be implanted with potassium ions, with only a second layer of tungsten layered on the first.

As is apparent, a primary advantage of the invention is that the grain boundaries located within certain structural metals will not become distorted as a result of lack of creep resistance at high homologous temperatures.

Another advantage of the invention is that the grain boundaries of the structural metals will not be distorted as a result of recrystallization at elevated temperatures.

Yet another advantage of the present invention is the great reduction in the number of required processing steps compared to conventional processing.

Still other advantages and benefits of the invention will become apparent to those skilled in the art upon a reading and understanding of the following detailed description.

DETAILED DESCRIPTION OF THE PREFERRED EMBODIMENT

Figure 1:
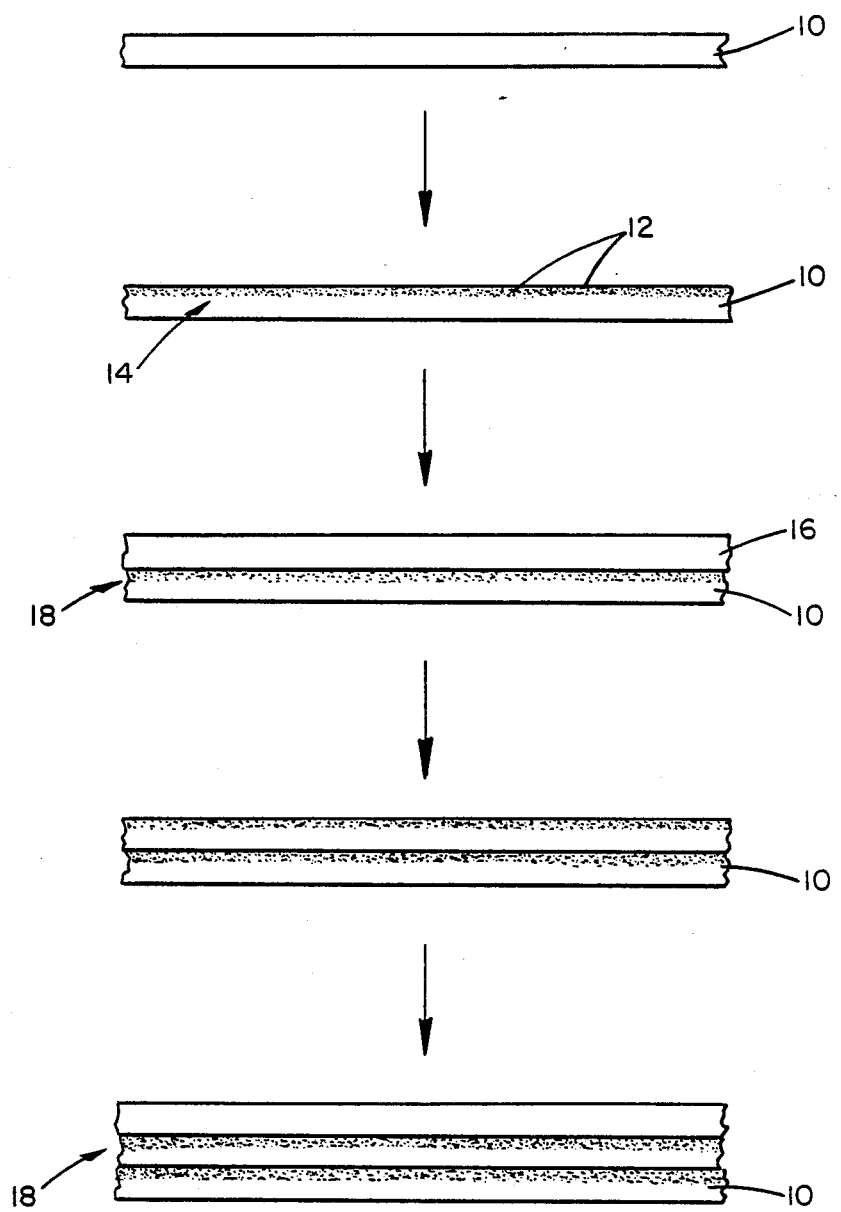
FIG. 1 shows a process of preparing creep resistant metals.

Referring now to FIG. 1, a method of forming a metal or metal alloy with a fine dispersion of ion-implanted atoms or dopant is disclosed here. More specifically, a method of forming internal high temperature barriers in structural metals to prevent movement of boundaries and dislocations for making said structural metals creep resistant at high homologous temperature is disclosed. The method consists of providing a first layer of structural or host metal, this metal being of a type that tends to creep at high homologous temperatures, and one that has zero or very low solubility for elements xenon, argon, neon, helium, krypton, potassium, rubidium, cesium, francium and mixtures thereof. The metals that can be used here are listed below in Table I.

Still referring to FIG. 1, a first layer of metal 10 is doped, implanted or impregnated with ions 12 to form an implantation region 14 wherein the ions consist of noble elements xenon, helium, argon, krypton, neon, or alkali elements potassium, rubidium, cesium, francium, or mixtures thereof. These ions are inserted into the first layer by direct or indirect methods including ion implantation, recoil implantation, or ion beam mixing, among others.

A second layer 16 of structural metal is deposited or layered onto the ion-implanted first layer of metal to form a laminated product or composite 18. Layering or providing the second layer of structural metal is accomplished by chemical or physical vapor deposition, plating, thermal spray deposition, electrolytic deposition, sputter deposition, pressure bonding, or by other methods.

The steps of implanting and layering a second layer can be repeated an arbitrary number of times to form multiple layers. Although the application of the second layer of metal is often the final step in forming the laminated product, an arbitrary number of layers can be applied. FIG. 1, by way of example, shows a total of two ion-implanted regions within three metal layers. Alloys of metals disclosed in Table I may be produced by mixing the vapors of the various elements or by alternating the layering or deposition of individual layers which would be homogenized by later heat treatment.

After enough layers have been stacked or piled, an internally-doped or ion-implanted metal sheet 18 remains. The ion-implanted elements are virtually insoluble in the structural metals, and will not readily diffuse through the structural metal sheet, even at high temperatures. Accordingly, this sheet can then be used to form lamp filament patterns, heat shields, thrust tubes for resistojets, turbines, or for other purposes.

The noble elements listed above (and in Table III) have smaller atomic volumes than those of the alkali elements listed above (and in Table II), and are not large compared with structural metals. The high temperature stability of noble gas bubbles may not be as great as the stability of the listed alkali elements at high temperatures. However, the noble gas bubbles that form within the metal do act to pin dislocations.

Figure 2B:
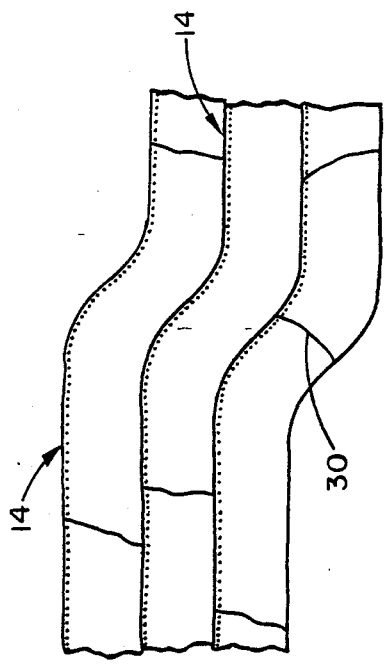
FIG. 2(b) shows the schematic view of FIG. 2(a) after recrystallization.
Figure 2A:
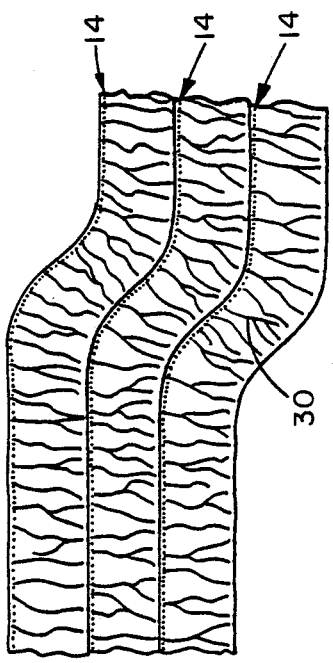
FIG. 2(a) shows a schematic view of a cross-section through a multi-layered metal sheet with ion-implanted regions.

FIG. 2(a) shows a schematic cross-section through a multi-layered metal sheet. Each sheet is relatively fine-grained (columnar grains) and has been ion-implanted with fine regions 14 of elements from the group listed in Tables II and III. The columnar grains 30 in the metal are apparent in this drawing.

After the metal layers are heat-treated, they are recrystallized. The grain boundaries 30 coarsen, as shown in FIG. 2(b), and are trapped at the ion-implanted regions 14, and a layered grain structure is provided. That is, grain boundaries that grow as a result of increased temperatures are stopped from travelling completely through the entire thickness of the metal layers by the regions 14 that have been ion-implanted.

Figure 3:
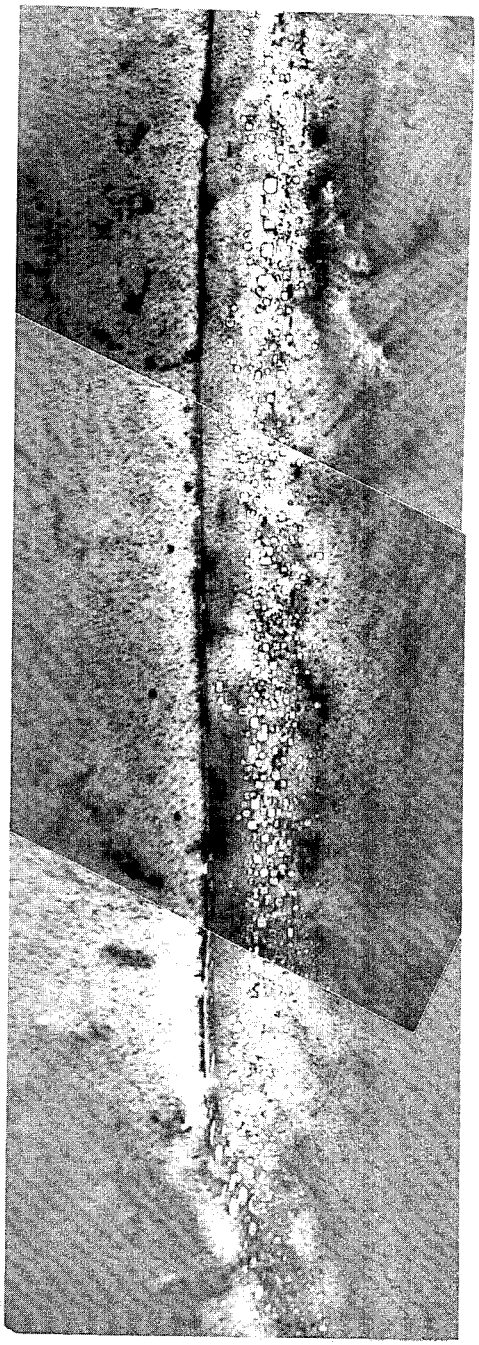
FIG. 3 is a TEM cross-section of an implanted boundary region with a series of bubbles having been formed to prevent grain growth.
Figure 4:
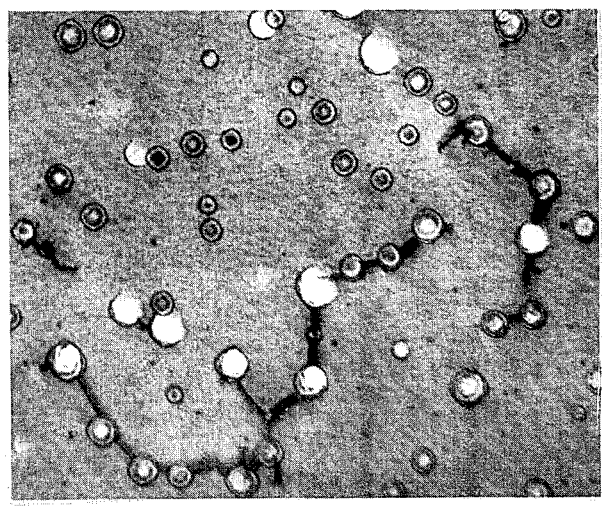
FIG. 4 shows potassium bubbles that grow along dislocations in the surface layer of tungsten.

FIG. 3 is a cross-section micrograph of a potassium-implanted boundary region in a rhenium double layer. The implanted metal was annealed at 2000K for four hours, and bubbles are shown to have formed as a result of the increased temperature. FIG. 4 is similarly provided to show that fine potassium bubbles form after annealing potassium-implanted tungsten at 2200° C. for one hour and at 2300° C. for 30 minutes. The bubble growth appears enhanced along an evident dislocation and by the proximity of a free surface. Bubble growth is partially the result of influx and absorption of vacancies. The bubbles tend to pin or stop the grain boundaries and dislocations from moving throughout the metal.

The geometric shape of the various layers of structural metal can vary. These layers can be planar, curved, rod-like, octagonal, etc. The only limitation as to shape results from the fact that the method of implanting requires a direct line of sight between the mechanism from which ions are sent, and the surface through which they are to be implanted.

Figure 5B:
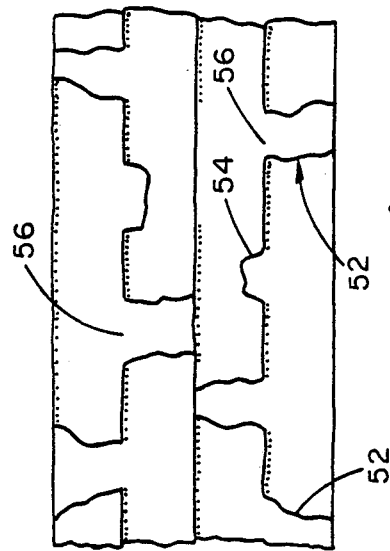
FIG. 5(b) shows an elevational view of the schematic view of FIG. 5(a) after recrystallization.
Figure 5A:
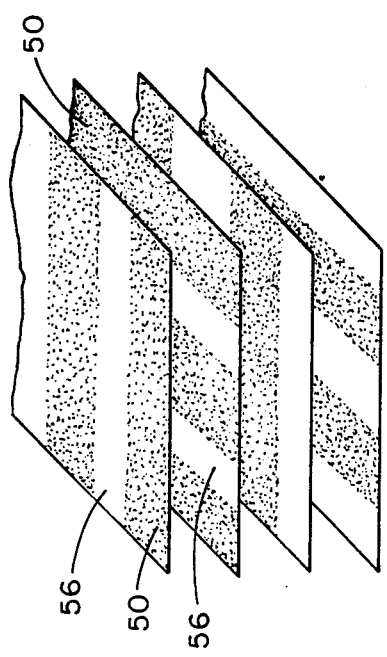
FIG. 5(a) discloses an exploded schematic perspective view of a geometrical pattern that may be used during ion implantation.

Not only can the shape of the various layers of structural metal vary, but the geometrical pattern that is used during ion implantation can vary as well. FIG. 5(a) shows one example of a pattern that can be used during ion implantation. Here, the dotted areas 50 indicate regions of ion-implanted elements in a multi-layered metal sheet. FIG. 5(b) shows the structure of FIG. 5(a) after recrystallization heat-treatment. The metal grains 52 have coarsened and form an interlocking grain boundary structure, or layers of grains with pegs 54 into neighboring layers at places where the implanted barrier layer has been interrupted 56, and this is in contrast to FIG. 2(b) where the implanted regions are the entire surface of each metal layer.

The method of ion implantation or ion beam mixing of the elements in Tables II and III (below) insures their incorporation into the metal lattice in an atomically fine distribution within the doped layers. Once the ions are implanted, they regain their electrons and become stable elements once again. The layer widths and dopant dosages can be adjusted by varying the ion implant or mixing parameters. The doped layers are sheet-like regions inside the material. They represent high densities of obstacles against dislocation or grain boundary motion. Because of the immobility of the large alkali atoms, one can expect these obstacles to be rather stable against coarsening at elevated temperatures. If there is some limited alkali atom transport at elevated temperature, small dopant bubbles form, as shown in FIGS. 3 and 4 for potassium-implanted rhenium and potassium-implanted tungsten. Such bubbles are known to form in tungsten lamp wire. As long as such bubbles do not coarsen, the dopant's obstacle role is maintained for very long periods of time, and as a result, creep resistance is provided for very long periods of time.

The following table lists the elements that represent and make up most of the technologically important structural metals and alloys. Their atomic volumes or sizes are indicated along with their melting temperatures and their solubilities for the dopant elements potassium, cesium, rubidium, and francium.

TABLE I

Structural metals, their atomic volumes, melting temperatures, and their solid solubilities for the alkali elements K, Rb, Cs and Fr.

| Element | Atomic Volume[1] cm$^3$/gram atom | Melting Temp[2] °C | Solid Solubility for the Alkali Elements | | | |
|---|---|---|---|---|---|---|
| | | | K | Rb | Cs | Fr |
| Be | 4.9 | 1277 | —, but compound K Be$_2$ exists (4) | | | |
| Mg | 14.0 | 650 | zero(6) zero(3) | zero(6) | zero(6) | |
| Al | 10.0 | 660 | zero(3) | zero(3) | very small(3) | |
| Ti | 10.7 | 1688 | very small(3) | | | |
| V | 8.9 | 1900 | | | | |
| Cr | 7.3 | 1875 | | | | |
| Mn | 7.5 | 1245 | | | | |
| Fe | 7.1 | 1537 | zero(3) | zero(3) | zero(3) | |
| Co | 6.7 | 1495 | —(3) | | | |
| Ni | 6.7 | 1453 | —(5) | | | |
| Cu | 7.1 | 1083 | | | | |
| Zn | 9.2 | 420 | KZr$_{13}$(3) | | | |

TABLE I-continued

Structural metals, their atomic volumes, melting temperatures, and their solid solubilities for the alkali elements K, Rb, Cs and Fr.

| | | | | | | |
|---|---|---|---|---|---|---|
| Y | 19.5 | 1509 | | | | |
| Zr | 14.0 | 1852 | very small(6) | | | |
| Nb | 11.0 | 2415 | zero(5) | | | |
| Mo | 9.4 | 2610 | very* small —(5) | | | |
| Tc | — | 2200 | | | | |
| Ru | 8.3 | 2500 | | | | |
| Rh | 8.4 | 1966 | | | | |
| Pd | 9.3 | 1552 | | | | |
| Ag | 10.3 | 961 | | | | |
| Hf | 14.0 | 2222 | zero(6) | | | |
| Ta | 11.2 | 2996 | —(6) | | | |
| W | 9.6 | 3410 | very* small | | | |
| Re | 8.8 | 3180 | | | | |
| Os | 8.5 | 2700 | | | | |
| Ir | 8.6 | 2454 | | | | |
| Pt | 9.1 | 1769 | —(3) | | | |
| Au | 10.2 | 1063 | zero(4) but several compounds exist | zero(4) but several compounds exist | —(4) but AuCs compound exists | |

| Rare Earth Elements | Atomic Volume | | | |
|---|---|---|---|---|
| La | 22-24 | 920 | | |
| Ce | 21 | 804 | | |
| Pr | 21 | 919 | | very small(6) |
| Nd | 21 | 1019 | | |
| Pm | — | 1027 | | |
| Sm | 20 | 1072 | | |
| Eu | 20 | 826 | | |
| Gd | 20 | 1312 | | |
| Tb | 19 | 1356 | | |
| Dy | 19 | 1407 | | |
| Ho | — | 1461 | | |
| Er | — | 1497 | | |
| Tm | — | 1545 | | |
| Yb | — | 824 | | |
| Lu | — | 1650 | | |

*Known from lamp industry practice
-No solubility indicated in the literature

[1]N. F. Mott and H. Jones; The Theory of the Properties of Metals and Alloys, Dover Publications 1958, pp. 318–319.
[2]W. G. Moffatt, G.W. Pearsall and J. Wulff: The Structure and Properties of Materials, John Wiley and Sons, vol. 1 (1967) 206, 207.
[3]M. Hansen and K. Anderko: Constitution of Binary Alloys, McGraw-Hill (1958).
[4]R. P. Elliott: Constitution of Binary Alloys, First Supplement. McGraw-Hill (1965).
[5]F. A. Shunk: Constitution of Binary Alloys, Second Supplement, McGraw-Hill (1969).
[6]W. G. Moffatt: The Handbook of Binary Phase Diagrams, General Electric Co., Schenectady, N.Y. (1978).

Table II below is contrasted with Table I. Table II contains the atomic volumes of the elements potassium, cesium, rubidium and francium. Most of the metal atom sizes are relatively small, e.g., per gram atom (one gram atom equals $6.02 \times 10^{23}$ atoms), and they occupy less than 15 centimeters cubed. Only yttrium and the rare earth elements, lanthanum through lutetium, are listed with larger sizes of up to 24 centimeters cubed per gram atom. But even they are small compared to the elements in Table II.

TABLE II

Large-sized alkali elements for doping Elements for ion implanting

| Element Alkali Elements | Atomic Volume[1] $\frac{cm^3}{gram\ atom}$ | Melting Temp.[2] (° C.) |
|---|---|---|
| K | 45.5 | 64 |
| Rb | 56.2 | 39 |
| Cs | 71.0 | 29 |
| Fr | (>70 estimated) | 27 |

[1]N. F. Mott and H. Jones; The Theory of the Properties of Metals and Alloys, Dover Publications 1958, pp. 318–319.
[2]W. G. Moffatt, G. W. Pearsall and J. Wulff: The Structure and Properties of Materials, John Wiley and Sons, vol. 1 (1967) 206, 207.

The larger sizes of the Table II atoms compared to the Table I metal atoms insures their diffusion immobility at high homologous temperatures in the metals. Homologous temperature is defined as a temperature below melting, normalized to the melting temperature.

A second prerequisite for having the Table II elements form stable bubbles of small size and thereby improve creep resistance is that they are insoluble in the metal lattice. From Table I, it is evident that data on solubilities are very sparse. Presumably, because of the large atomic size differences, there is little or no solubility of the mentioned elements in any of the listed metals. Where experimental data exist, the solubilities are either zero or very small.

The highest probability for improvement of creep resistance is expected in the metals with the largest size difference compared to the elements of the group consisting of potassium, rubidium, cesium and francium.

Examples of potassium-doped tungsten and molybdenum, used in the lamp industry indicate that improvement of creep resistance can be expected in the metal whose atomic volumes are less than 10 cubic centimeters per gram atom. For them, the size difference to the alkali atoms, K, Rb, Cs, and Fr is very large. The size difference decreases for the larger sized metals, e.g. Mg, Zr, Hf, and the rare earth metals. However, the doping may work for them too, especially when doping with rather large Rb, Cs, or Fr atoms.

The noble gas elements in Table III are not as large as the alkali elements in Table II. However, they too are virtually insoluble in structural metals and can form stable, small bubbles which in turn pin grain boundaries and dislocations. As long as these bubbles do not coarsen appreciably at high temperature they provide microstructural barriers against the movement of grain boundaries and dislocations and therefore provide creep resistance.

TABLE III

Elements of the Noble Gas Group

| Element | Solubility in the Solid State of Structural Metals |
|---|---|
| He | |
| Ne | All are virtually insoluble |
| Ar | in structural metals. |
| Kr | |
| Xe | |

Doping may be done with one or several of the elements listed in Tables II and III. The repeat distance of doped layers, the doped concentration in the layers, the ion implant or ion mixing depth are all parameters that can be optimized. Also, the ion-implanted layers may be arranged in a multitude of geometrical patterns in order to promote interlocking grain formation during later recrystallization. Grain boundary sliding, a form of creep, is minimized with an interlocking grain structure. Many geometrical implant patterns may be feasible, and FIG. 5(a) illustrates one example that differs from implanting the entire sheet. However, no attempt is made here to predict an optimal arrangement.

Figure 6A:
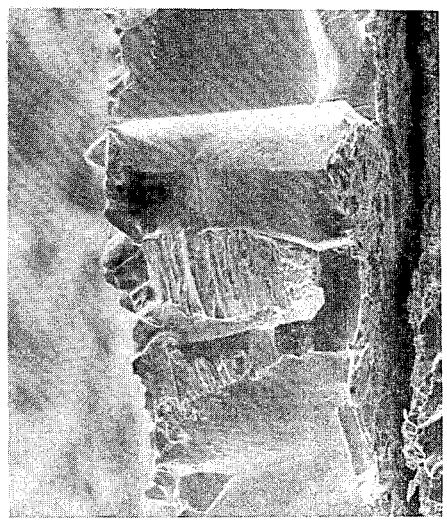
FIG. 6(a) is a fracture cross-section of rhenium double layer prepared without ion implantation.
Figure 6B:
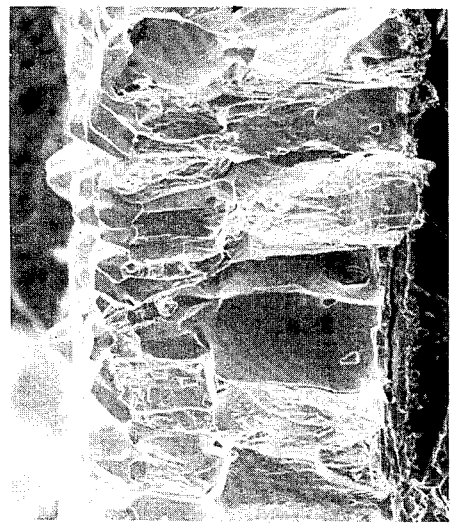
FIG. 6(b) shows the cross-section of FIG. 6(a) after annealing at 2000K for four hours.
Figure 6C:
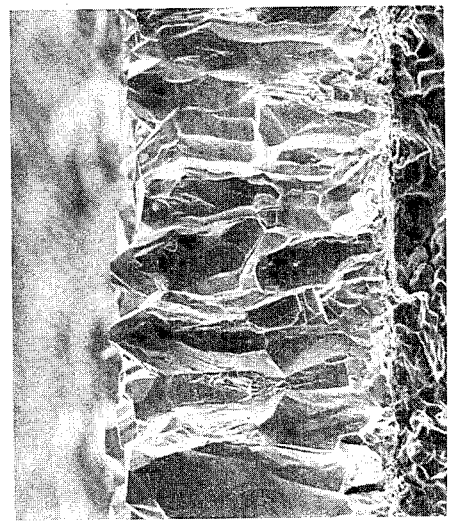
FIG. 6(c) is a fracture cross-section of a double layer of rhenium prepared with potassium ion implantation.
Figure 6D:
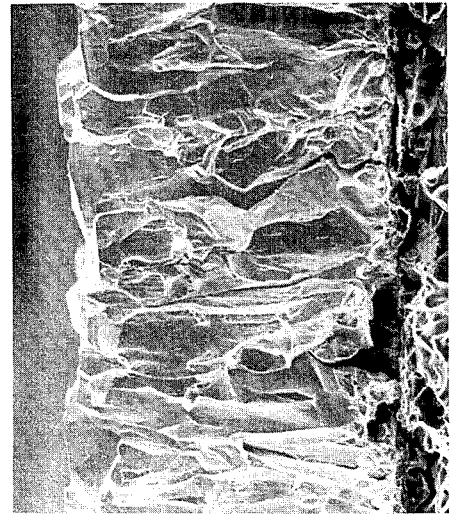
FIG. 6(d) shows the cross-section of FIG. 6(c) after annealing at 2000K for four hours.

With attention now to FIGS. 6(a)–(d), SEM micrographs of fracture cross-sections through rhenium double layers are shown. FIGS. 6(a) and 6(b) have been prepared without doping, and FIGS. 6(c) and 6(d) include a potassium ion-implanted layer.

Shown in the figures is a substrate. The substrate is not always a necessary base for layering structural metal, but is provided here because a first layer of rhenium was deposited thereon by chemical vapor deposition. Potassium ions were next implanted into the first layer, and a second layer of rhenium was deposited on the first ion-implanted layer. FIGS. 6(a) and 6(b) show the rhenium prepared without potassium doping, and 6(c) and 6(d) show rhenium prepared with doping.

Further, 6(a) and 6(c) show the elements as deposited while 6(b) and 6(d) show the same elements after they have been subjected to recrystallization and annealing at 2000K. The barrier effect of the ion-implanted layer is evident in 6(d). After recrystallization, the grain boundaries shown in 6(b) travelled the entire height of the double rhenium layer. By contrast, the grains of FIG. 6(d) travelled only up to the potassium barrier layer.

Because the grain boundaries travel only a percentage of the distance through the rhenium, as a result of the potassium layer, it is evident that the doping with potassium caused the stabilization of a creep resistant, overlapping grain structure.

Figure 7:
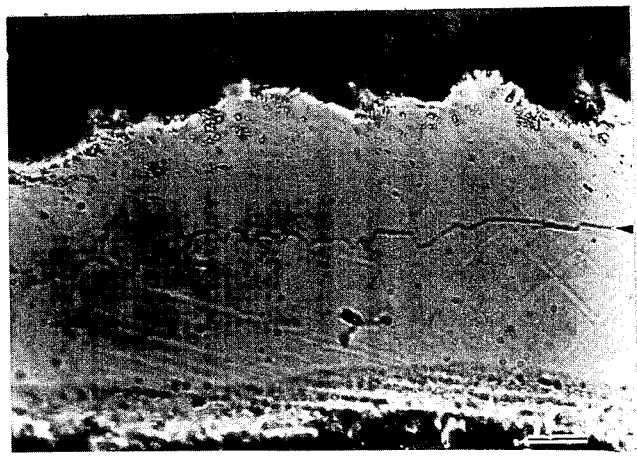
FIG. 7 shows a rhenium double layer ion-implanted with potassium as recrystallized at 1750° C. for two hours.

With reference to FIG. 7, chemically vapor deposited rhenium (CVD) layers were ion-implanted with potassium, with doses of $1\times10^{16}$, $1\times10^{17}$ and $3\times10^{17}$ ions/cm$^2$ at 150 eV, and an additional layer of rhenium was vapor deposited on top of the implanted layer. After recrystallization at 1750° C. for two hours, the rhenium grains grew from less than twenty micrometers to over 100 micrometers in size. However, grain boundaries remained at the location of the ion-implanted potassium layer, thus preventing the grain boundaries from traversing the width of the rhenium sheet. By contrast, when a double CVD layer of rhenium without the potassium implantation recrystallizes, the boundaries of the recrystallized grains traverse the entire width of the rhenium layer to form a columnar microstructure without overlapping grains which is known to leave poor creep resistance at elevated temperature.

EXAMPLE I

Ribbon Lamp Filaments

The process as described may be applied to the production of lamp filaments with wire, ribbon, or tube. A suitable substrate, for example, molybdenum, is provided upon which a layer of tungsten is deposited on the order of several micrometers' thickness by chemical vapor deposition or physical vapor deposition. The tungsten layer is then implanted with ions to a depth on the order of 0.1 micrometers. This creates the ion implant barrier layer. A second layer of tungsten is then deposited by chemical vapor deposition or physical vapor deposition, again on the order of several micrometers' thickness. Additional layers of ion implant and tungsten deposition may be repeated any number of times or the process may be terminated after the second layer of tungsten is deposited.

The filament is then shaped by pressing, rolling or punching. The shaping process would take place at a temperature above 600° C. to prevent brittle fracture. Some plastic deformation is desired, because during annealing or burning of the filament it provides a driving force for grain growth in a direction parallel to the a barrier layers. By this process, an elongated overlapping grain structure is achieved which enhances the creep resistance of the filament material. The high temperature stability of the internal barrier layers guarantees the stability of the overlapping grain structure during the filament life.

The filament is then annealed in the manner similar to that known for standard coiled filaments. Annealing treatment sets the shape of the filament and prevents excessive spring back during the subsequent removal of the substrate.

The molybdenum substrate is etched away in a manner similar to that known in the processing of standard coiled filaments. The ends of the ribbon filament are clamped for current conduction in accordance with the known standard procedure. The filament is then mounted in a lamp envelope in accordance with known standard procedures.

EXAMPLE II

Heating Ribbons for Rapid Thermal Annealing Units

Rapid annealing units are used to anneal silicon wafers in a short time (a few seconds) to permit healing of crystal defects while diffusional rearrangement of dopants must be kept to a minimum. The growth of thin oxide films on Si may be another purpose of rapid annealing. Excellent temperature constancy is required over the area of a silicon disc. Arrays of tungsten wire filaments are often used to radiate heat over the work area. Ribbon filaments may be more advantageous to provide uniform heating over relatively large areas, on the order of 10"×10".

The procedure of making heating ribbons is similar to that described in Example I for making ribbon lamp filaments. A brief outline of making a molybdenum ribbon is provided:

1. One obtains a thin foil of molybdenum, e.g., rolled or vapor-deposited, and its surface should be clean, i.e., free of scales or contamination.

2. A barrier layer is ion-implanted into the molybdenum surface. The implanted layer is comprised of an element of the group K, Rb, Cs, Fr, or of the noble element group He, Ne, Ar, Kr, Xe. The implantation depth may range approximately from 1 to 1000 nm, and the implantation dose may range approximately from $10^{13}$ to $10^{17}$ per cm$^2$, with the optimum dose depending on the chosen implant depth. As the desired depth increases, the dosage, too, should increase. The lower doses, i.e., those on the order of approximately $10^{13}$, are used for shallow implantations, i.e., where the implantation depth is approximately 10 nm. The higher dosages apply to deeper implantations, i.e., those that are approximately 1 micron deep. The typical peak concentration in an implant layer (the depth at which ion implantation concentration is the highest) ranges from 0.01% to 5% (atomic percent) of implanted atoms as compared to the surrounding atoms.

3. A second layer of molybdenum is deposited on the ion-implanted molybdenum to bury the barrier layer inside a laminated ribbon structure. Steps 2 and 3 may be repeated.

4. The ribbon laminate then is deformed, e.g., by rolling, to reduce it to a desired thickness or by stamping, cutting, or bending it into the desired shape of a heating ribbon.

EXAMPLE III

Heat Shields

Heat shields are useful in vacuum furnaces, rocket and aircraft engines, containments of high temperature plasma, nuclear reactors, and other areas.

Heat shields are often made of refractory sheet metal or alloy, contoured for the specific application. Below is a description of making such sheet with an internal high temperature barrier layer.

1. Slabs or sheets of the desired alloy, e.g., Mo-0.5% Ti-0.1% Zr alloy are provided. The surfaces should be clean (oxide or other scale must be removed).

2. A barrier layer is ion-implanted into the surface with the barrier layer comprising, an element of the group K, Rb, Cs, Fr or the noble element group He, Ne, Ar, Kr, Xe. The implantation depth may range approximately from 1 to 1000 nm. The implantation dose may range approximately from $10^{13}$ to $10^{17}$ per cm$^2$, with the optimum dose depending on the chosen implant depth. The implantation may be made continuous over the surface, or may be made in a pattern, such that upon recrystallization treatment of the final product a microstructure develops of overlapping grains, with occasional pegging in those areas where the absence of barrier permits the growth of grain into the neighboring layer.

3. Two or more implanted slabs are placed on top of each other such that they form a laminated structure. The laminated structure is then encapsulated in an evacuated can (the can material will later be removed).

4. The laminated structure is diffusion-bonded together at elevated temperature and under applied pressure, e.g., by hot isostatic pressing.

5. The structure is hot-rolled or forged into the desired thickness and shape, and the can material is removed by etching.

EXAMPLE IV

Thrust Tube for Resistojet

Resistojets are devices used for positioning or rotation of satellites or space structures. The devices are usually small and develop thrust forces that may be on the order of a few grams. The thrust is derived from ejection of gaseous matter, e.g., hydrogen or NH$_3$ gas. The pressure for ejection is developed by heating in a resistively-heated chamber and thrust tube. High temperature is desired for good thrust efficiency. High temperature creep resistance and thermal shock resistance are required of the structural metals. Rhenium or tungsten-rhenium alloy are good candidates for this purpose. Below is a description of how the method of buried ion-implanted barrier layer can be used to fabricate a creep resistant thruster tube.

1. A Re layer of several micrometer thickness is deposited onto the circumference of a cylindrical substrate, e.g., a Mo mandrel which will later be removed. Chemical vapor deposition is a suitable method for forming this layer.

2. A barrier layer of an element of the group K, Rb, Cs, Fr or of the noble element group He, Ne, Ar, Kr, Xe is ion-implanted into the Re surface. The cylinder should be rotated in the ion beam to permit implantation over the entire circumference. Implantation depth may range approximately from 1 to 1000 nm. Implantation dose may range approximately from $10^{13}$ to $10^{17}$ per cm$^2$, the optimum dose depending on the chosen implant depth. The implantation may be made continuous over the surface, or may be made in a pattern, such that upon recrystallization treatment of the final product a microstructure develops of overlapping grains, with occasional pegging in those areas where the absence of barrier permits the growth of grain into the neighboring layer.

3. A second layer of Re is deposited, as in Step 1, to bury the barrier layer. Steps 2 and 3 may be repeated.

4. The composite cylinder is swaged, drawn or forged to a desired diameter.

5. The Mo mandrel is removed by selective etching. The remaining Re tube has internal annular barriers which will guide the grain growth during high temperature recrystallization to form a creep resistant, overlapping grain structure. This structure should enable higher use temperatures in resistojets.

EXAMPLE V

Layer Composite for Turbine Blade

The principal stress direction due to centrifugal forces is along the long axis of a turbine blade. Grain boundaries that are perpendicular to this stress axis are unwanted because they can become sites of failure initiation during high temperature operation. Grain boundaries that are parallel to the stress axis are not detrimentally affected. To obtain this microstructural condition, directional solidification is practiced on nickel-base superalloy turbine blades.

Single crystal blades in which grain boundaries are altogether eliminated can be grown. The growth of a well-behaved columnar grain structure along the blade axis or the growth of a flawless single crystal blade becomes increasingly difficult with increasing blade thickness. Thin slabs can be grown with greater perfection.

A concept is described of how buried, ion-implanted barrier layers can be used to produce a laminated, recrystallized grain structure in which grain boundaries are rather perfectly oriented along the blade axis with no or only few transverse boundaries.

1. Superalloy slabs with thicknesses that are a fraction of the thickness of the intended turbine blade are used. Polycrystalline or single crystal slabs can be used. The surfaces must be clean.

2. A barrier layer of an element of the group K, Rb, Cs, Fr or of the noble element group He, Ne, AR, Kr, Xe, is ion-implanted into the surface of the superalloy slabs. The implantation depth may range approximately from 1 to 1000 nm. The implantation dose may range approximately from $10^{13}$ to $10^{17}$ per cm$^2$, the optimum dose depending on the chosen implant depth. The implantation my be made continuous over the surface, or may be made in a pattern, such that upon recrystallization treatment of the final product a microstructure develops of overlapping grains, with occasional pegging in those ares where the absence of barrier permits the growth of a grain into the neighboring layer.

3. Two or more implanted slabs are placed on top of each other such that they form a laminated structure. The external contours of the slabs should be contoured such that the laminate has the approximate shape of the intended turbine blade.

4. The laminate is encapsulated in an evacuated can (the can material will later be removed), and the laminate is diffusion-bonded together at elevated temperature and under applied pressure, e.g., by hot isostatic pressing.

5. The can material is removed, e.g., by etching.

6. The blade is machined to proper dimensions.

7. The blade is subject to a recrystallization treatment, preferably through a temperature gradient along its axis. Grain growth will be guided by the buried barrier layers to produce a laminate grain structure along the blade axis. Only in areas where the barrier has been interrupted intentionally, pegging of grains into neighboring layers can occur with transverse boundaries in such locations.

The invention has been described with reference to the preferred embodiment. Obviously, modifications and alterations will occur to others upon reading and understanding the preceding specification. It is intended that the invention be construed as including all such alterations and modifications insofar as they come within the scope of the appended claims or the equivalent thereof.

What is claimed is:

1. A method of forming internal high temperature barriers in structural metals to prevent movement of boundaries and dislocations for making said structural metals creep resistant at high homologous temperature, the method comprising the steps of:

providing a first layer of undoped structural metal that creeps at high homologous temperatures and has zero or very low solubility for the group of elements consisting of xenon, helium, neon, argon, krypton, potassium, rubidium, cesium, and francium;

implanting ions in said first layer of metal to form a first implantation region, said ions being members of the group consisting of the elements xenon, helium, neon, argon, krypton, potassium, rubidium, cesium, francium and mixtures thereof; and, layering a second layer of undoped structural metal on said first ion implanted layer to form a composite, the implantation region buried inside the composite.

2. The method of claim 1 wherein the atomic volume of the ion-implanted element is greater than the atomic volume of the structural metal.

3. The method of claim 2 wherein the atomic volume of the ion-implanted element is at least approximately twice that of the structural metal.

4. The method of claim 1 wherein said first layer is provided as a generally flat sheet whereby the step of implanting ions is accomplished along an unobstructed path.

5. The method of claim 1 wherein the step of layering the second layer of structural metal is accomplished by vapor deposition.

6. The method of claim 1 wherein the step of layering the second layer of structural metal is accomplished by plating.

7. The method of claim 1 wherein the step of layering the second layer of structural metal is accomplished by thermal spray deposition.

8. The method of claim 1 wherein the step of layering the second layer of structural metal is accomplished by electrolytic deposition.

9. The method of claim 1 wherein the step of layering the second layer of structural metal is accomplished by sputter deposition.

10. The method of claim 1 wherein the step of layering the second layer of structural metal is accomplished by pressure bonding.

11. The method of claim 1 wherein the structural metal that creeps at high homologous temperatures is a member of the group consisting of: Be, Mg, Al, Ti, V, Cr, Mn, Fe, Co, Ni, Cu, Zn, Y, Zr, Nb, Mo, Tc, Ru, Rh, Pd, Ag, Lu, Hf, Ta, W, Re, Os, Ir, Pt, Au, La, Ce, Pr, Nd, Pm, Sm, Eu, Gd, Tb, Dy, Ho, Er, Tm, Yb and alloys thereof.

12. The method of claim 1 wherein the ions are implanted directly.

13. The method of claim 1 wherein the atomic size of the implanted element is significantly larger than that of the structural metal and the implanted elements cannot readily diffuse through the structural metal at high homologous temperature.

14. The method of claim 1 wherein the ion-implanted atoms are finely dispersed in thin films within the composite and form fine bubbles in these regions to pin against the movement of dislocations and grain boundaries thereby conteracting creep and recrystallization in undesired directions.

15. The method of claim 1 wherein the steps of implanting and layering are repeated to form a second ion implantation region and a third layer of undoped structural metal.

16. A method of making internal high temperature barriers in structural metals to prevent movement of boundaries and dislocations within the metals and for making said structural metals creep resistant at high homologous temperature, the method comprising the steps of:
providing a first layer of implanted structural metal that creeps at high homologous temperatures and has zero or very low solubility for the group of elements consisting of xenon, helium, neon, argon, krypton, potassium, rubidium, cesium and francium;
implanting a first batch of ions on said first layer of metal to form a first implantation region, said ions being members of the group consisting of xenon, helium, neon, argon, krypton, potassium, rubidium, cesium and francium;
layering a second layer of structural metal on said first ion-implanted layer;
implanting a second batch of ions on said second layer of metal to form a second implantation region; and,
layering a third layer of structural metal on said second ion-implanted layer to form a laminated product having a plurality of ion-implanted regions interspersed within the structural metal.

17. The method of claim 16 further including the steps of:
implanting a third batch of ions on said third layer of metal; and
layering a fourth layer of structural metal on said third ion implanted layer to form a laminated product.

18. A method of making metal creep resistant, the method comprising the steps of:
providing a first layer of metal from the group consisting of Be, Mg, Al, Ti, V, Cr, Mn, Fe, Co, Ni, Cu, Zn, Y, Zr, Nb, Mo, Tc, Ru, Rh, Pd, Ag, Hf, Ta, W, Re, Os, Ir, Pt, Au, La, Ce, Pr, Nd, Pm, Sm, Eu, Gd, Tb, Dy, Ho, Er, Tm, Yb, Lu and alloys thereof;
impregnating the first layer with ions from the group consisting of alkali elements and noble gases; and,
forming a second layer of metal on said first impregnated layer, the ions providing a barrier against creep among the metal layers.

19. The method of claim 18 wherein the applicable alkali elements are selected from the group consisting of potassium, rubidium, cesium, and francium.

20. The method of claim 18 wherein the noble gases are selected from the group consisting of xenon, argon, neon, krypton and helium.

21. The method of claim 18 further including fashioning a filament.

22. A method of making a lamp filament, the method comprising the steps of:
providing a substrate;
depositing on said substrate a first layer of undoped structural metal of the group consisting of W, Mo, Ta, Re, Os and alloys thereof;
implanting ions in said first layer of undoped metal, said ions being members of the group consisting of xenon, helium, neon, argon, krypton, potassium, rubidium, cesium, francium and mixtures thereof;
depositing a second layer of undoped structural metal on said first ion-implanted layer to produce a laminated product; and,
forming a lamp filament.

23. A lamp filament made in accordance with the method of claim 22.

24. The method of claim 22 wherein the steps of implanting and depositing are repeated at least one time.

25. The method of claim 22 wherein the step of forming comprises selectively deforming, cutting or stamping the laminated product into a predetermined geometry.

26. The method of claim 22 wherein said substrate is iron.

27. The method of claim 22 wherein said substrate is provided as a generally flat member wherein the path for applying ions is not obstructed.

28. The method of claim 22 wherein the additional step of etching away the substrate is provided.

29. The method of claim 22 wherein the structural metal is tungsten.

30. The method of claim 22 wherein the ions are potassium ions.

31. A method of making refractory metal creep resistant at high homologous temperature, the method comprising the steps of:
providing a first layer of refractory metal;
implanting in said first layer a fine film of ions from the group consisting of K, Rb, Cs, Fr and mixtures thereof; and
layering a second layer of refractory metal on said first ion-implanted layer.

32. The method of claim 31 wherein the refractory metal is of the group consisting of Zr, Nb, Mo, Tc, Ru, Hf, Ta, W, Re, Os and Ir.

33. The method of claim 31 wherein the melting temperature of the refractory metal ranges from 1850° C. to 3500° C.

34. The method of claim 31 wherein the ion-implanted elements are insoluble in the refractory metals.

35. A creep resistant laminate comprising:
a first layer of undoped structural metal of the group consisting of Be, Mg, Al, Ti, V, Cr, Mn, Fe, Co, Ni, Cu, Zn, Y, Zr, Nb, Mo, Tc, Ru, Rh, Pd, Ag, Hf, Ta, W, Re, Os, Ir, Pt, Au, La, Ce, Pr, Nd, Pm, Sm, Eu, Gd, Tb, Dy, Ho, Er, Tm, Yb, Lu and alloys thereof;
ions from the group consisting of K, Rb, Cs, Fr, He, Ne, Ar, Kr, Xe, and mixtures thereof, said ions implanted into said first layer to form an ion implantation region; and,
a second layer of undoped structural metal layered on said first ion-implanted layer of structural metal.

36. The creep resistant laminate of claim 35 wherein a plurality of ion-implanted structural metal layers are included on said first layer of structural metal.

37. A method of making tungsten creep resistant at high homologous temperatures, the method comprising:
providing a first layer of tungsten;
impregnating said first layer of tungsten with potassium ions to form an ion-implanted layer; and,
layering a second layer of tungsten on said ion-impregnated layer to form a laminated product.

38. The method of claim 1 wherein said first layer is provided as a curved member whereby the step of implanting ions is accomplished along an unobstructed path.

39. The method of claim 1 wherein the ions are implanted indirectly.

40. The implanted product produced in accordance with the process of claim 1.

41. The method of claim 16 wherein the ion implanted regions are thin films within the laminated product.

42. The method of claim 16 wherein the concentration of each ion implantation region ranges from about 0.01% to about 5%.

43. The method of claim 22 wherein said substrate is provided as a generally curved member.

44. The creep resistant laminate of claim 35 wherein the ion concentration in the ion implantation region ranges from about 0.01% to about 5% (atomic percent).

45. A creep resistant structural metal comprising:
a first layer of undoped structural metal that creeps at high homologous temperatures;
a second layer of undoped structural metal that creeps at high temperatures; and,
a thin film of ions implanted between the metal layers to prevent creep among the metal layers.

46. The creep resistant structural metal of claim 45 wherein the metals are selected from the group consisting of: Be, Mg, Al, Ti, V, Cr, Mn, Fe, Co, Ni, Cu, Zn, Y, Nb, Mo, Tc, Ru, Rh, Pd, Ag, Lu, Hf, Ta, W, Re, Os, Ir, Pt, Au, La, Ce, Pr, Md, Pm, Sm, Eu, Gd, Tb, Dy, Ho, Er, Tm, Yb, and alloys thereof.

47. The creep resistant structural metal of claim 45 wherein the ions are selected from the group consisting of: xenon, helium, neon, argon. krypton, potassium, rubidium, cesium, francium and mixtures thereof.

* * * * *